United States Patent [19]

Faran, Jr. et al.

[11] Patent Number: 4,620,304

[45] Date of Patent: Oct. 28, 1986

[54] METHOD OF AND APPARATUS FOR MULTIPLEXED AUTOMATIC TESTING OF ELECTRONIC CIRCUITS AND THE LIKE

[75] Inventors: James J. Faran, Jr., Lincoln; Matthew L. Fichtenbaum, Chelmsford; William C. Kabele, Littleton, all of Mass.

[73] Assignee: Gen Rad, Inc., Concord, Mass.

[21] Appl. No.: 710,535

[22] Filed: Mar. 13, 1985

Related U.S. Application Data

[63] Continuation of Ser. No. 417,215, Sep. 13, 1982, abandoned.

[51] Int. Cl.$^4$ ............................................. G01R 31/28
[52] U.S. Cl. .................................... 371/20; 324/73 R; 371/15
[58] Field of Search ............................ 371/15, 20, 25; 324/73 R, 73 AT, 73 PC

[56] References Cited

U.S. PATENT DOCUMENTS

| | | | |
|---|---|---|---|
| 4,300,207 | 11/1981 | Eivers et al. | 371/20 X |
| 4,339,819 | 7/1982 | Jacobson | 371/20 X |
| 4,354,268 | 10/1982 | Michel et al. | 371/20 |
| 4,392,107 | 7/1983 | Gollomp | 324/73 R |
| 4,397,021 | 8/1983 | Lloyd et al. | 371/20 |

Primary Examiner—Charles E. Atkinson
Attorney, Agent, or Firm—Cesari and McKenna

[57] ABSTRACT

This disclosure is concerned with the automatic testing of electronic circuits and assemblies and the like containing large numbers of nodes, with reduced replications of test instruments and thus significantly reduced cost, through permitting a number of driver-sensors to be selectively switched to a larger number of nodes of the circuit being tested in accordance with a method of specifying and allocating the connections of the nodes of that circuit to the pins associated with each driver-sensor (or group thereof) that insures that no conflicts arise in connecting the driver-sensors to various groups of nodes for carrying out the desired tests.

18 Claims, 6 Drawing Figures

METHOD OF AND APPARATUS FOR MULTIPLEXED AUTOMATIC TESTING OF ELECTRONIC CIRCUITS AND THE LIKE

This is a continuation application of Ser. No. 417,215, filed Sept. 13, 1982, now abandoned.

The present invention relates to the automatic testing of electronic circuits or assemblies with the aid of test instruments, controlled by a computer or similar apparatus, that provide excitation or stimulus signals to nodes of the assembly under test, analog and digital, and measure responses; being more particularly directed to novel methods of and apparatus for such testing employing fewer or minimum numbers of replications of such instruments and with each such instrument switched to various connection points with limitation on the range of such connection points to which any instrument can be connected, the assignment of assembly nodes to the connection points being such as to avoid conflicts in use thereof.

Circuit testing apparatus presents an interface to the assembly under test consisting of a plurality of connection points. Since circuit assemblies may assume many different sizes and shapes, fixtures are employed which make contact with those connection points and provide whatever unique mechanism may be needed to contact the external nodes, or both external and internal nodes, of the assembly under test. Such contacts with nodes of the assembly under test are sometimes made by means of spring-loaded pins touching the metallic conductor of the nodes; the fixtures usually containing wiring connecting each spring pin or other contacting device to connection points which mate with those of the testing apparatus.

There are two broad classes of test systems currently used in the art, functional and in-circuit. Functional testing is conducted by connecting the tester only to the nodes of the assembly to be tested that are those used in its normal application. These nodes are called the external nodes. Signals applied during functional tests of a circuit resemble, more or less, the signals which would be present in its normal application. Functional testing therefore, is designed to determine whether all components of the assembly work successfully in concert with each other.

In in-circuit testing, each component of the assembly is tested individually, independent of the other components. The test routine thus consists of a sequence of many independent routines, each of which controls the testing of one of the components. Generally, the test instruments are connected to nodes of the assembly under test in a unique way for each such individual test routine. In the process, during the various tests of the individual components, instruments are connected to substantially all the nodes of the assembly under test, at one time or another.

In-circuit test apparatus thus requires the ability to make connection to more nodes of the assembly being tested than functional test apparatus; but, in general, at any one time, uses fewer test instruments.

The present invention is concerned with making such testing more economical by reducing the number of test instruments required, and is particularly applicable to in-circuit testing at the present time, though also useful in other types of testing, including functional, as, for example, in conjunction with a pre-wired "universal fixture" for testing a family of circuit boards, or in a system employing a dual fixture, where test instruments might be connected to one side while the assembly being tested was being handled on the other side.

In this specification, phrases and terms and variants thereof are employed which are intended to have rather specific meanings; definitions accordingly being tabulated as follows:

Circuit Under Test—Any assembly of electrical-electronic components electrically connected to form a complete or partial electronic circuit which is to be tested by the testing apparatus herein described.

Pin—Broadly, the connection, sometimes including the electronic circuits associated therewith, to an electrical node of a circuit under test (named after the spring contact pins often used for the purpose).

Node (of a circuit under test)—One of the electrical interconnection points or terminals of the electronic circuit.

Testing Apparatus—A collection of apparatus, usually computer-controlled, for verifying that an electronic circuit assembly has been correctly assembled from the proper components.

Connection Point (of a testing apparatus)—One of the points of the testing apparatus where connections are made (usually by means of a fixture) to the circuit under test.

Fixture—An assembly by means of which the connection points of a testing apparatus are connected to the nodes of a circuit under test (often containing spring contact pins in a "bed-of-nails" arrangement).

Analog Instrument—Any one of a number of types of electronic apparatus which are intended to make measurements of parameters of analog (non-digital) components of an electronic circuit. Such instruments may, for example, measure resistance, capacitance or inductance of components or may measure currents or voltages present in the circuit under test. Each such instrument may require from two to four or more connections to nodes of the circuit in order to operate.

Digital Instrument—Electronic apparatus which is capable of applying digital electronic signals to a circuit under test, or of sensing the logic state (high or low) of the signals generated by a circuit under test.

Driver-Sensor—A combination of two types of digital instruments which is capable of driving a digital signal to a node of the circuit assembly under test and/or of sensing the logic state of that node.

Digital Signal—An electrical signal which varies with time and which has a high probability of being at one of two voltage levels (high or low).

Analog Signal—An electrical signal which varies with time and which has a continuous range of possible voltage levels.

One type of prior art architecture used in such testing systems as the types 1792, 1796, and 2270 of GenRad, Inc., the assignee of the present invention, attaches analog instruments to the assembly to be tested by a switch array, with digital instruments being connected directly. For example, replicated pairs of drivers and sensors associated with digital instruments are used with the drivers exciting the assembly and the sensors testing its response. Digital pins and analog pins may be connected to the same assembly node to form hybrid pins capable of supporting digital or analog test signals.

Another basic type of architecture in which both analog and digital instruments are attached to the circuit assembly to be tested employs a switch array, with any pin electrically connectable to any test instrument.

Products involving this type of structure have been made by Fairchild/Faultfinders, Inc., 15 Avis Dr., Latham, N.Y. and Zehntel, Inc., 2625 Shetlands Dr., Walnut Creek, Calif. This type of architecture is illustrated in U.S. Pat. No. 4,070,565 of Zehntel. Other relevant patents of Instrumentation Engineering, Inc., Franklin Lakes, N.J., illustrating this type of architecture include U.S. Pat. Nos. 3,832,535; 3,854,125; 3,922,537 and 4,102,491.

Still another testing architecture approach involves directly connecting digital drivers and attaching one digital sensor by a switch array to various points of the assembly to be tested. This type of configuration is described, for example, in U.S. Pat. No. 4,216,539 of Zehntel.

Prior art digital test instruments have thus been connected to the assembly to be tested in two basic ways. First, instruments ae replicated to allow direct connection between each instrument and a node of the assembly to provide a number of digital instruments equal to or greater than the number of nodes of the assembly. Alternatively, a necessary few instruments are attached to the assembly by way of a switch array in the same manner as for analog instruments, above described. As with the analog case, the switch array contains a great number of switches to allow each node of the assembly to be electrically connected to any of the digital instruments present in the test system apparatus.

It has been found, in accordance with the present invention, that a significant reduction in required replications of test instruments used in the prior art and thus reduction in cost can be achieved through permitting a number of driver-sensors to be selectively switched to a larger number of nodes of the circuit being tested in accordance with a novel method of specifying the connections of the nodes of that circuit to the pins associated with each driver-sensor (or group thereof) that insures that no conflicts arise in connecting the driver-sensors to various groups of nodes for carrying out the desired tests.

More specifically, the invention provides an improved method of and apparatus for more efficient structuring of the automatic test equipment used to test electronic circuits and similar assemblies. The invention requires that (a) connection points between the automatic test equipment and the circuit be partitioned into groups;

(b) each group be connected to test equipment, or a subset of the test equipment, of the automatic test equipment by a switching means; and (c) the connection points be assigned (connected) to the circuit nodes in such a way that conflicts in test instrument application do not arise.

In general, the switching means allows each connection point to be connected to instrument types suitable for conduct of the test, but it does not allow any connection point to be connected to any test instrument at any time, as in the prior art.

Broadly, thus, the invention employs a medium number of digital instruments, each connectable to any one (or more) of a group of the nodes of the assembly by means of a switch array, such that all assembly nodes may be electrically connected to a test instrument. While there are a number of (usually identical) switch arrays for digital test equal to the number of groups of the nodes of the assembly, the invention employs a modest number of instruments and very many fewer switches than in the prior art, resulting in significant economy.

It should be noted, as before stated, that the architecture of the invention does not allow any node of the assembly under test to be electrically connected to any of the digital instruments, as with the prior art. Each node can be connected to a digital instrument, but not to any digital instrument.

A further economy of the invention resides in attaching analog instruments via a switch array to the common points between digital instruments and the digital switch arrays. Thus, the analog connecting array is significantly smaller than is required in the prior art.

Prior to the invention, however, it was not apparent that the above architecture could really achieve, in practice, the desired results. Since there are fewer digital instruments than there are nodes of the assembly under test in accordance with the invention, cases can arise where more digital instruments are required to be active at nodes of a group than there are digital instruments associated with (and connectable to) that group. Such a conflict, when it occurs, actually precludes testing. It has been discovered, however, that such conflicts can be avoided by application of a method of assigning nodes of the assembly under test to connection points of the test apparatus which operates to prevent conflicts. Such assignment is implemented in the fixture which adapts from the connection points of the test apparatus to means (often a so-called bed-of-nails) for making contact with all nodes of the circuit assembly under test.

An object of the present invention, accordingly, is to provide a new and improved, more efficient and less costly method of and apparatus for automatic testing of electronic circuits and assemblies and the like, that unlike the above-described and similar prior art systems, employ a significantly reduced number of digital test instruments without impairing the capability of the test apparatus and while reducing the number of switches required to make full use of analog test instruments.

A further object is to provide a novel method of and apparatus for digital and/or analog multiplexed automatic testing of electronic circuits and the like.

Other and further objects will be explained hereinafter and are more particularly delineated in the appended claims.

In summary, however, from one of its important aspects, the invention embraces a method of performing a test on electronic circuits and the like comprising a relatively large number of nodes, that comprises assigning each node to a connection point in a group of connection points connectable at any given time with only a predetermined number of signal lines connectable with test equipment, the predetermined number of signal lines being less than the number of connection points in the group; controlling said assigning of the nodes to specific connection points in a manner that insures that no more sets of nodes, used simultaneously in any test, are assigned to the same group of connection points than there are signal lines connectable to that group of connection points, wherein, at a given time, a set of nodes is defined as the set consisting of all the nodes assigned to the same group and logically capable, according to the test, of being driven or sensed by a common instrument at that given time; and selectively connecting the connection points to the test equipment to connect the test equipment to the nodes for conducting desired testing. Preferred apparatus and techniques and best mode embodiments are hereinafter presented.

The invention will now be described in connection with the accompanying drawings.

FIG. 1 of which is a schematic circuit diagram illustrating a simple, though exemplary, application of the invention to digital testing;

Figure 1:
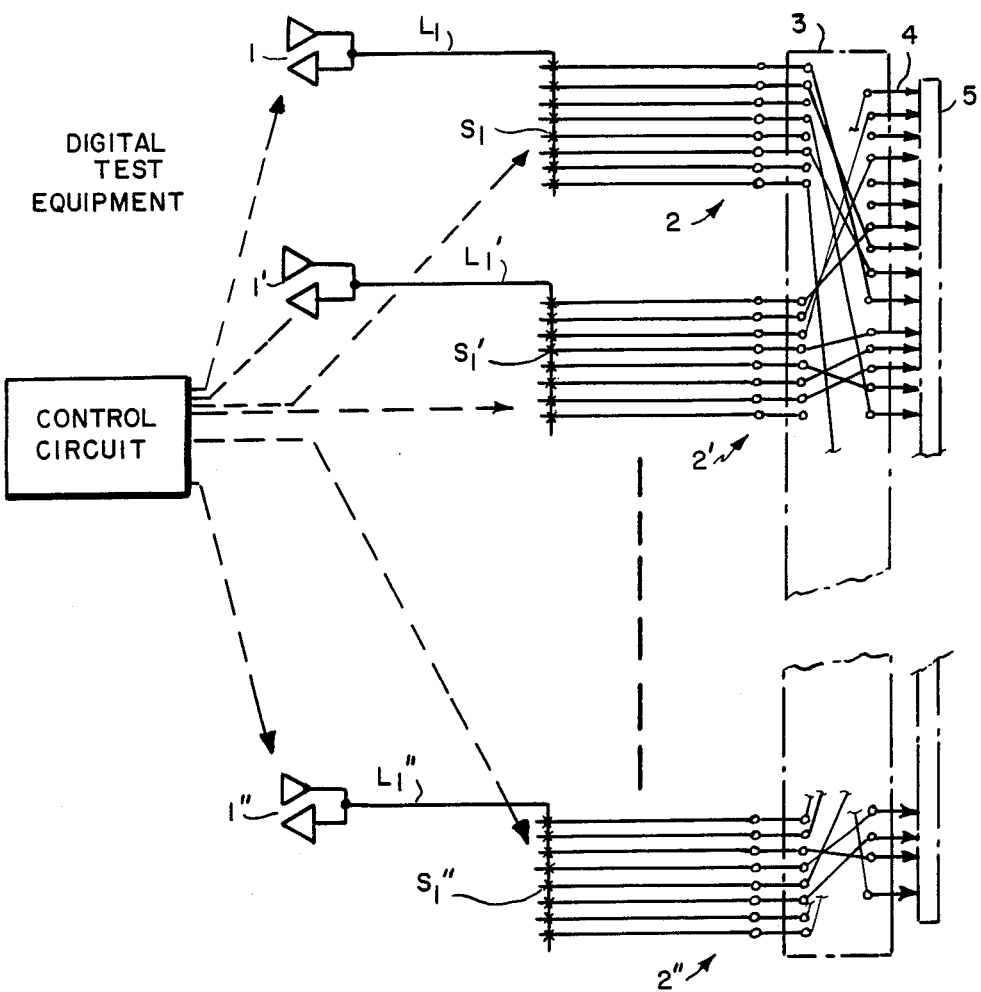

Referring to the simple example of the invention illustrated in FIG. 1, each driver-sensor circuit 1, 1' . . . 1" comprises a set of two digital instruments, a driver and a sensor, that have a common test port. That is, the port at which the driver drives is the same as the port at which the sensor senses, so the driver cannot be connected to drive a set of nodes different from that which the sensor is connected to sense. (As used here and in the claims, a set can consist of a single element.) Each driver-sensor is shown connectable in multiplex fashion to eight connection points 2, 2' . . . 2". Thus, for a system with 3840 connection points, only 480 driver-sensors are needed (and 3840 switches). In recognition of the fact that in in-circuit testing of the components of a digital circuit many fewer driver-sensors are used at any one time than there are connection points to the unit under test, the invention thus embodies significantly fewer driver-sensor circuits than connection points, and employs switches $S_1$, $S_1$ . . . $S_1"$ (cross-point switches diagramatically illustrated by crosses) to allow each driver-sensor circuit 1, 1' . . . 1" to be connected to a number of connection points in the groups 2, 2' . . . 2", with the test equipment associated with the driver sensors being generally referenced to the left. On the right, a fixture 3, such as a so-called bed-of-nails fixture, connects the connection points in the groups 2, 2', . . . , 2" to board contacts 4 so positioned with respect to each other as to permit them simultaneously to contact all of the test nodes on a circuit board 5 under test. No two connection points in any group of eight (2, 2' . . . 2") can be connected to nodes of the circuit assembly corresponding to different terminals of a component during the test of that component because there is only one driver-sensor behind that group. For this reason, it is necessary to assign nodes of the unit under test to connection points in such a way as to insure that the above condition is met. This can be done, once the test program has been written or generated, by assigning connection points so that no more than one connection point used in any individual component test is assigned within an eight-connection point group. This assignment can easily be carried out with the aid of a digital computer.

Figure 2:
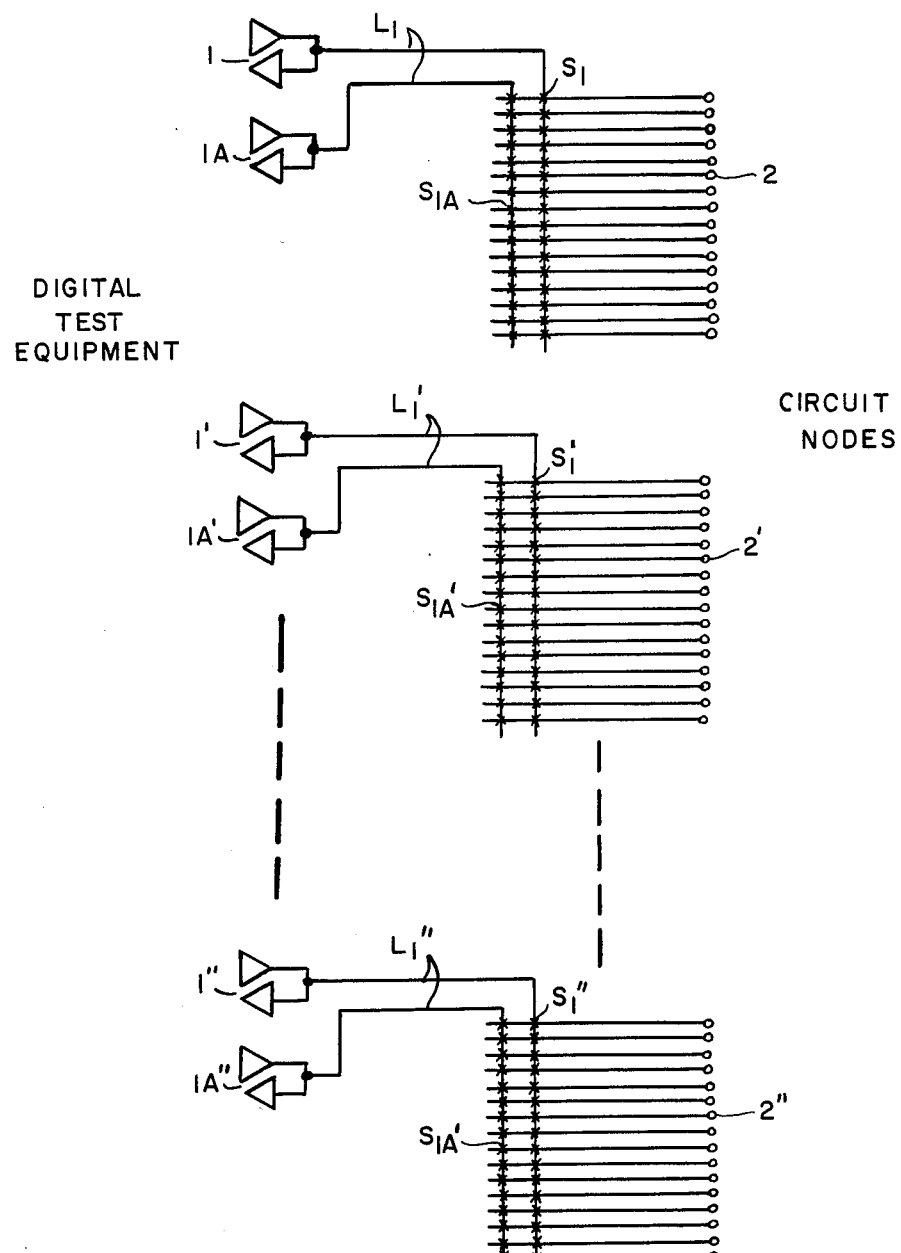
FIGS. 2 and 4 are similar diagrams of preferred embodiments.

In a preferred embodiment of this invention, shown in FIG. 2, there is a set of two driver-sensors 1-1A, 1'-1A' . . . 1"-1A" behind each group of (sixteen) connection points 2, 2' . . . 2", and switches $S_1$-$S_{14}$, $S_1'$-$S_{14}'$ . . . $S_1"$-$S_{14}"$ arranged so that each driver-sensor can be connected to any of the corresponding sixteen connection points. Although four digital instruments, two drivers and two sensors, are associated with each group, they constitute only two separately connected sets of digital instruments, not four sets as they would if pairs of digital instruments did not have ports in common. This multiplexing arrangement is done for two reasons; so that resistance measurements (for shorts tests, for example) can be made between any two connection points, and so that two different connections can be made to any one connection point, as is done to improve the accuracy of linear or analog (as opposed to digital) measurements.

In this case, it is necessary to assign nodes of the assembly under test to connection points in such a way that no more than two nodes used in any test of one component are assigned within a group of sixteen connection points. Again, once the test program has been generated, this assignment can be carried out easily with a digital computer.

In the case of a tester for purely digital circuit assemblies, economy is achieved by (a) providing fewer driver-sensors than one for each connection point, and (b) providing fewer switches than would allow any driver-sensor to be connected to any connection point. In this digital case, if there are N connection points and M driver-sensors, the arrangement may permit each driver-sensor to be connected to any one or more of a group n of the connection points, thus requiring N switches. In a preferred embodiment, the arrangement may permit any of m driver-sensors to be connected to any one or more of a group of n of the connection points; in this case, requiring m×N switches. In either of these arrangements, the number of switches required can be far fewer than the M×N switches that would be required if each of the N driver-sensors were connectable to any of the N connection points.

Figure 3:
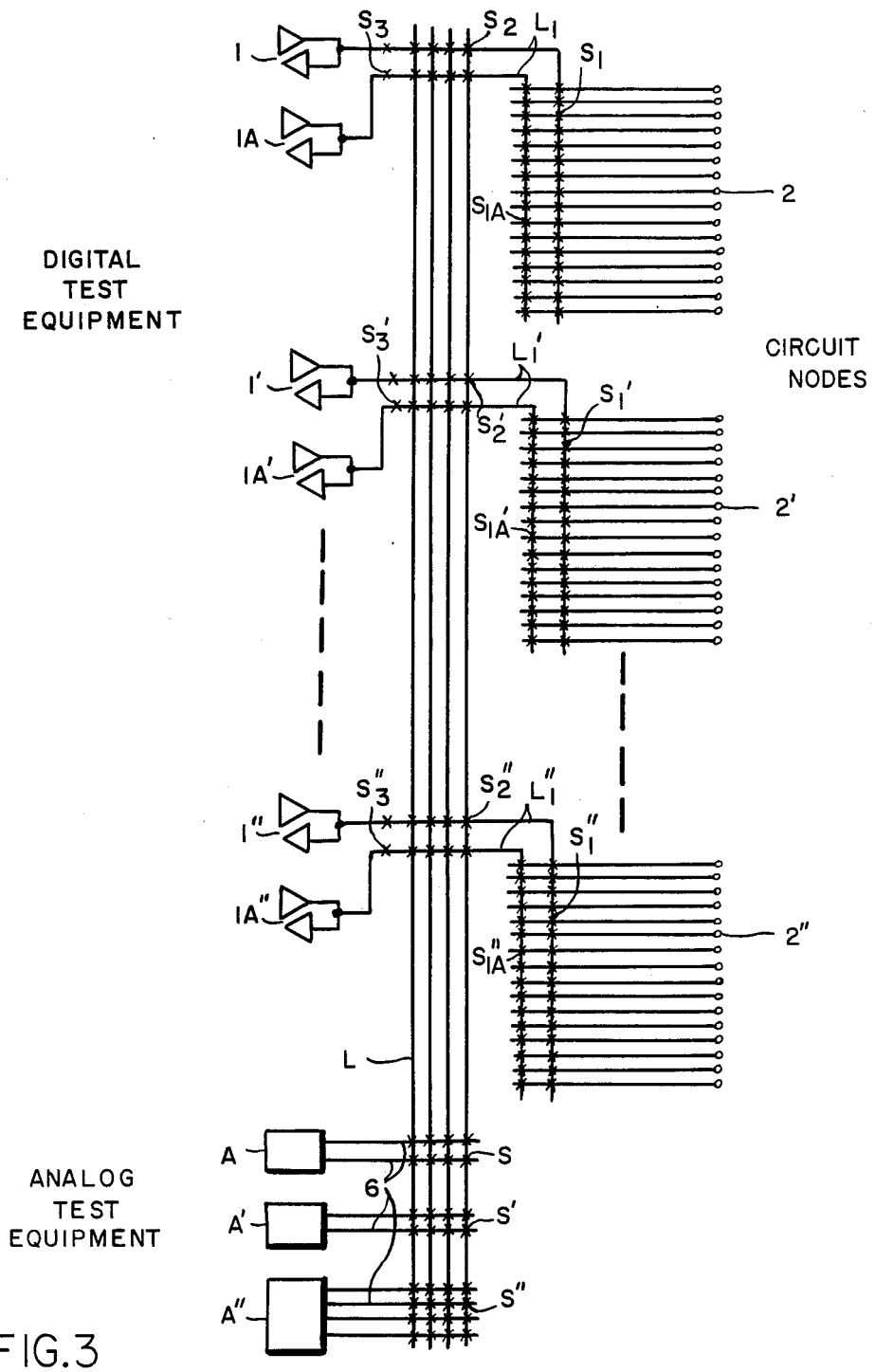
FIGS. 3 and 5 are further modifications adapted for both digital and analog testing.

When the test system is capable of making both analog and digital tests, means must be provided for connection of the analog instruments to the connection points. FIG. 3 shows how that can be done according to this invention. It is the same arrangement as FIG. 2, with the addition of, in this case, four bus lines L for connection of the analog instruments, A, A', A" to the connection points. Switches S, S' . . . S" allow instrument lines 6 from the analog instruments to be connected to the analog bus lines L. Switches $S_2$, $S_2'$ . . . $S_2"$ allow those analog bus lines to be connected to any of the 480 intermediate lines L1, L1', . . . , L1". Also included are one switch per driver-sensor $S_3$, $S_3'$ . . . $S_3"$ to allow it to be disconnected during analog measurement.

Figure 4:
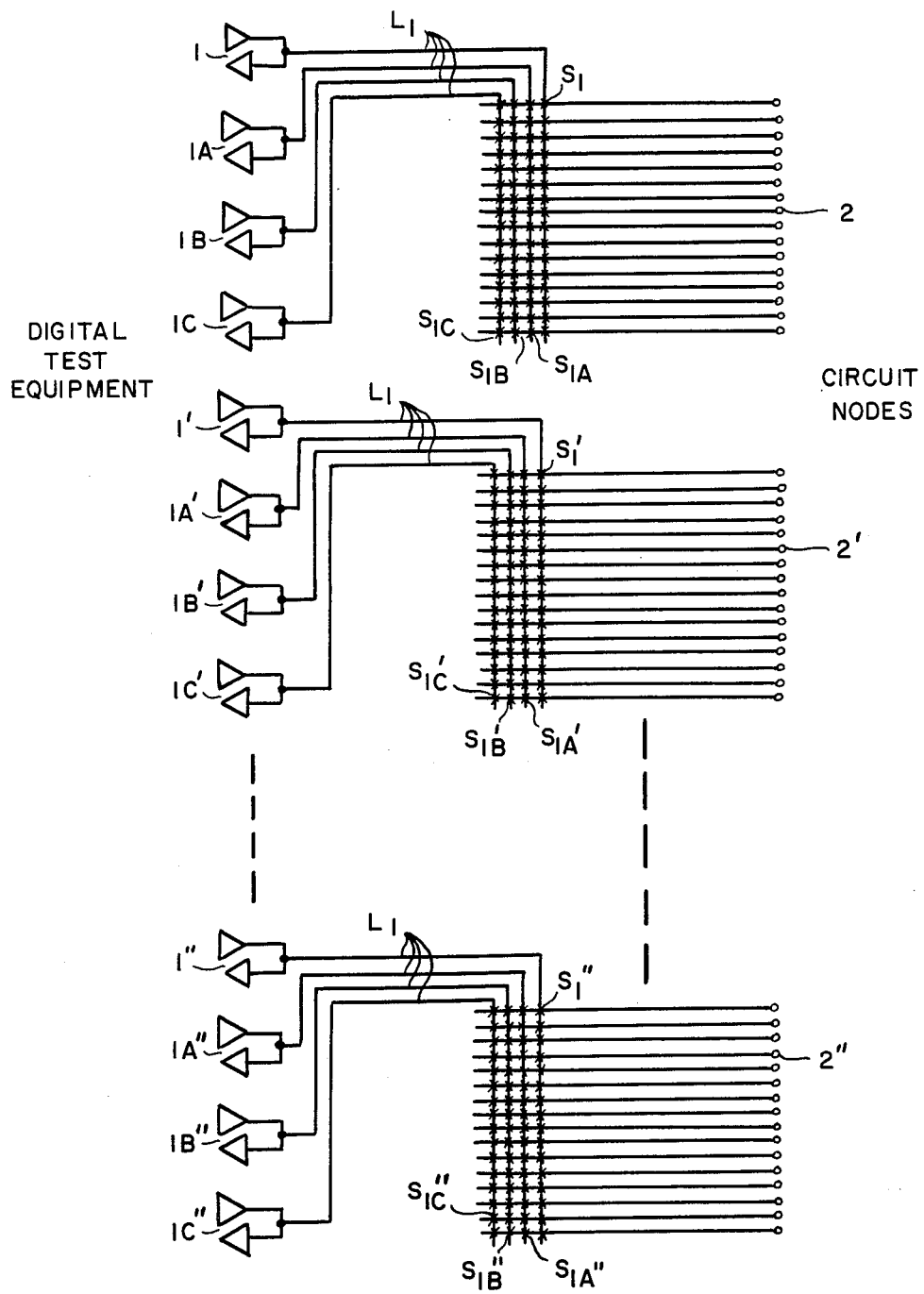
Figure 5:
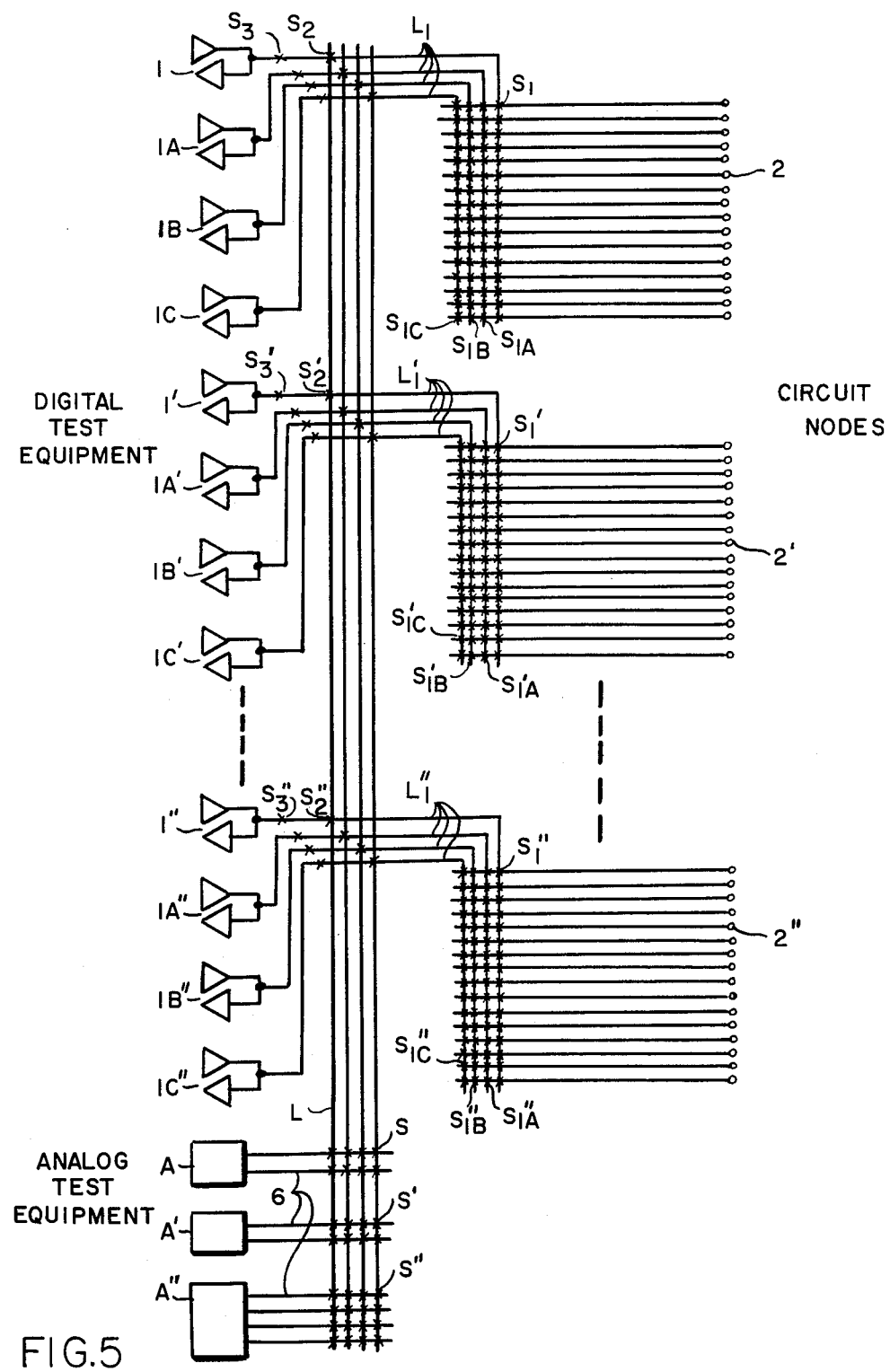

Another preferred embodiment of the invention is shown in FIG. 4 wherein a set of four driver-sensors 1-1A-1B-1C, 1'-1A'-1B'-1C' . . . 1"-1A"-1B"-1C" is provided behind each group of sixteen connection points 2, 2' . . . 2". Analog instruments A, A', A" can also be connected in such a system by adding switches as in FIG. 5 so that each of the analog bus lines L can be connected to one of the intermediate lines of each group. This format is advantageous when four analog bus lines are also used, since each can be connected by means of a switch to one of the intermediate lines L1, L1', . . . , L1". A switch to disconnect the driver-sensor circuit during analog measurements is also provided as at $S_3$, $S_3'$ . . . $S_3"$. In the case of FIGS. 4 and 5, it is necessary to assign nodes of the unit under test to connection points in such a way that no more than four connection points in any group are used simultaneously in the test of any component. This assignment can also be carried out in a straightforward manner using a digital computer, as before mentioned.

Figure 6:
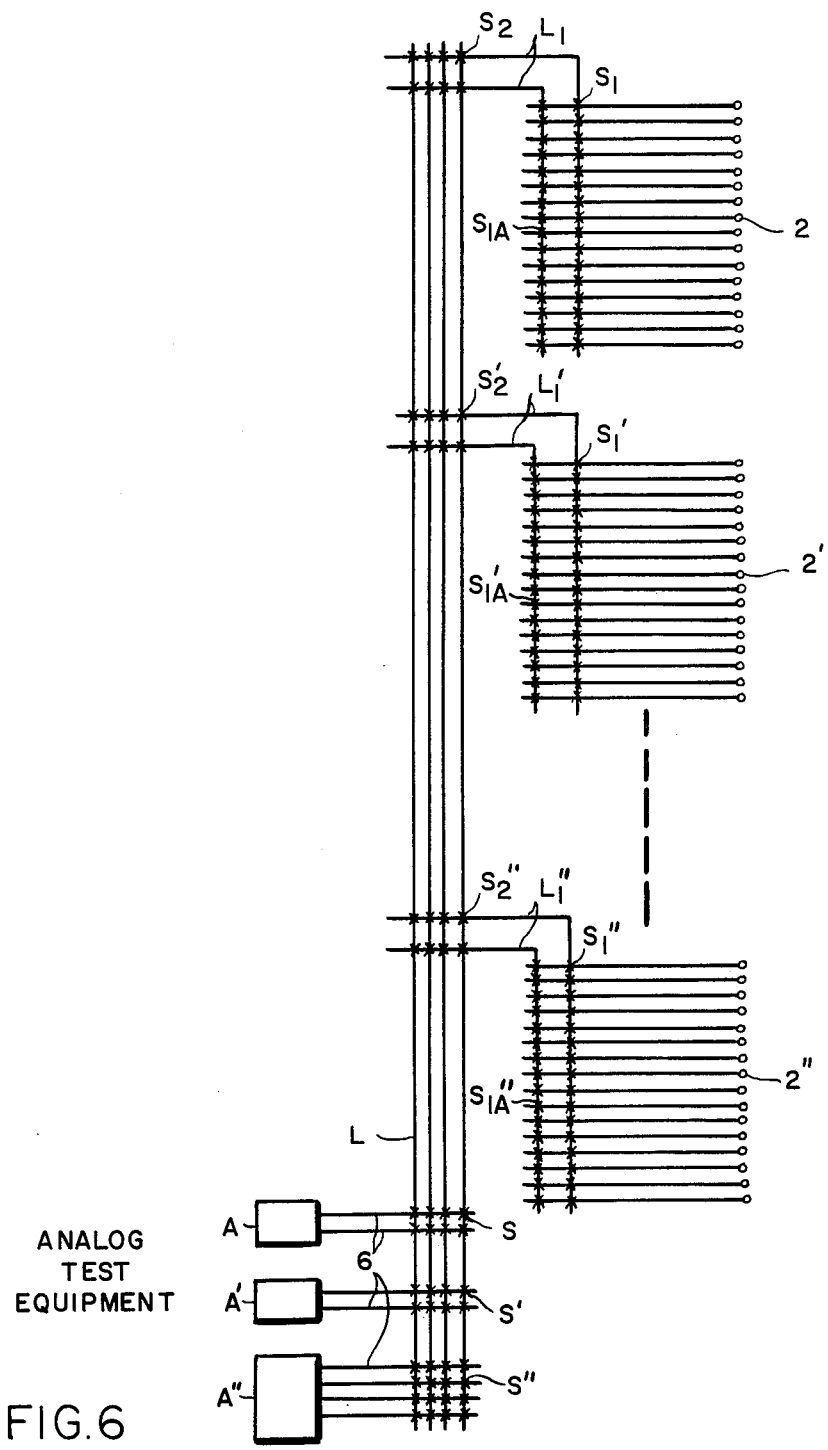
FIG. 6 illustrates the method of the invention applied to analog testing alone.

The same principles of the invention, furthermore, can be used in a system which does only testing of analog components (a system in which there are no driver-sensors). Such a system is illustrated in FIG. 6, as a sub-combination of the total system of FIG. 3. Sets of intermediate lines $L_1, L_1' \ldots L_1''$ (normally from the driver sensors in the digital test equipment format) with cross-connection switches $S_2, S_2' \ldots S_2''$ effect connection of the analog lines L selectively to desired connection points of the groups of connection points. For example, with K analog instrument lines switchable to permit each of the K lines to be connected to any one or more of M lines, with the remainder of the switches connected so as to permit each of a group of m of those M lines to be connected to any one or more of a corresponding group n of the N connection points, a total of $m \times N + M \times K$ switches would be required. This can be far fewer than the number $(K \times N)$ that would be required if each of the K analog lines were connectable to any of the N connection points, as in the prior art previously discussed.

The object of the method of assigning nodes of the circuit assembly under test to specific connection points of the test apparatus is to insure that no more nodes, used simultaneously in any sub-test, are assigned into the same group of connection points than there are instruments connectable to those connection points. For a system architecture as previously described in connection with the embodiment of FIG. 1, this limit is one per group. For a system as shown in FIG. 3, the limit is two per group. For a system as shown in FIG. 5, the limit is four per group. When, as in in-circuit tests of all the individual components of an assembly, many different combinations of connections are used, the limit must not be exceeded in any of those sets of connections.

A most useful approach for assigning nodes to pins, and useful algorithm concepts for the previously discussed digital computer assignment control to achieve the efficiency and insure lack of instrument conflict, will now be addressed.

The test program is created before nodes can be assigned to connection points. When the limit is one node per group (FIG. 1) of connection points, a two-dimensional array is set up having as indices the numbers of the nodes of the circuit assembly. By reading each segment of the test program, and finding every node-pair involved in that segment of the test procedure, each such node pair can be marked in the array. Then, when a trial is made of assigning a second or subsequent node into a group of connection points, the elements of the array having the indices of the node being assigned and those of nodes already assigned within the group are checked to insure that the new node does not interfere in any test segment with any already assigned.

It had been initial concern during the evolution of the invention that in assigning nodes to pins, one would encounter problems of efficiency; i.e., that many more pins than the number of nodes in the circuit on the board might be required or that many more driver-sensors than the maximum number used simultaneously in one test might be needed. The method invented, however, produced highly efficient allocations.

The following TABLE I presents the results of the application of this technique in a system which multiplexes on a 1 by n basis, including the number of nodes on seven different circuit boards, the maximum number of nodes used simultaneously, the number of pin groups used, etc., and the efficiency of the resulting allocation. The efficiency is measured either as the number of pin groups needed to have one pin for each node or the number of pin groups needed to have enough driver-sensors for simultaneous use divided by the number of pin groups actually used.

TABLE I

EFFICIENCY OF ASSIGNMENT OF NODES TO PINS
FOR A SYSTEM WHICH MULTIPLEXES ON A 1 × N BASIS
FOR SEVEN DIFFERENT CIRCUIT BOARDS

| NODES ON BOARD | MAXIMUM NODES IN ONE BURST | ASSIGNED IN GROUPS OF | NUMBER OF GROUPS NEEDED FOR TOTAL NODES | FOR MAX NODES PER BURST | NUMBER OF GROUPS USED | EFFI-CIENCY | RATIO OF TOTAL NODES TO MAX NODES PER BURST |
|---|---|---|---|---|---|---|---|
| 175 | 47 | 1 × 4 | 44 | 47 | 59 | 0.80 | 3.7 |
| | | 1 × 6 | 30 | | 50 | 0.94 | |
| | | 1 × 8 | 22 | | 49 | 0.96 | |
| | | 1 × 16 | 11 | | 49 | 0.96 | |
| | | 1 × 32 | 6 | | 49 | 0.96 | |
| 198 | 44 | 1 × 4 | 50 | 44 | 57 | 0.88 | 4.5 |
| | | 1 × 6 | 33 | | 48 | 0.92 | |
| | | 1 × 8 | 25 | | 47 | 0.94 | |
| | | 1 × 16 | 13 | | 45 | 0.98 | |
| | | 1 × 32 | 7 | | 44 | 1.00 | |
| 222 | 54 | 1 × 4 | 56 | 54 | 64 | 0.87 | 4.1 |
| | | 1 × 6 | 37 | | 54 | 1.00 | |
| | | 1 × 8 | 28 | | 54 | 1.00 | |
| | | 1 × 16 | 14 | | 54 | 1.00 | |
| | | 1 × 32 | 7 | | 54 | 1.00 | |
| 265 | 24 | 1 × 4 | 67 | 24 | 70 | 0.96 | 11.0 |
| | | 1 × 6 | 45 | | 50 | 0.90 | |
| | | 1 × 8 | 34 | | 39 | 0.87 | |
| | | 1 × 16 | 17 | | 28 | 0.86 | |
| | | 1 × 32 | 9 | | 25 | 0.96 | |
| 685 | 60 | 1 × 4 | 172 | 60 | 172 | 1.00 | 11.4 |
| | | 1 × 6 | 115 | | 116 | 0.99 | |
| | | 1 × 8 | 86 | | 89 | 0.97 | |
| | | 1 × 16 | 43 | | 63 | 0.95 | |
| | | 1 × 32 | 22 | | 61 | 0.98 | |
| 695 | 54 | 1 × 4 | 174 | 54 | 175 | 0.99 | 12.9 |
| | | 1 × 6 | 116 | | 118 | 0.98 | |
| | | 1 × 8 | 87 | | 89 | 0.98 | |
| | | 1 × 16 | 44 | | 61 | 0.89 | |

TABLE I-continued

EFFICIENCY OF ASSIGNMENT OF NODES TO PINS
FOR A SYSTEM WHICH MULTIPLEXES ON A 1 × N BASIS
FOR SEVEN DIFFERENT CIRCUIT BOARDS

| NODES ON BOARD | MAXIMUM NODES IN ONE BURST | ASSIGNED IN GROUPS OF | NUMBER OF GROUPS NEEDED FOR TOTAL NODES | FOR MAX NODES PER BURST | NUMBER OF GROUPS USED | EFFI-CIENCY | RATIO OF TOTAL NODES TO MAX NODES PER BURST |
|---|---|---|---|---|---|---|---|
|  |  | 1 × 32 | 22 |  | 58 | 0.93 |  |
| 1574 | 59 | 1 × 4 | 394 | 59 | 396 | 0.99 | 26.7 |
|  |  | 1 × 6 | 263 |  | 268 | 0.98 |  |
|  |  | 1 × 8 | 197 |  | 211 | 0.93 |  |
|  |  | 1 × 16 | 99 |  | 134 | 0.74 |  |
|  |  | 1 × 32 | 50 |  | 100 | 0.59 |  |

When the limit is two nodes per group (FIG. 3), a three-dimensional array must be used, in which triples of nodes involved in the same segment are marked. When the limit is four nodes per group (FIG. 5), a five-dimensional array is needed, in which quintuples of nodes involved in the same test segment are marked. In these cases, a similar procedure is followed to ensure that the limit is not exceeded.

To set up the before-described three-dimensional array for a 3000-node board would require a virtual memory of 3400 Megabytes, and to set up a five-dimensional array for the same number of nodes would require 30 kilo-Mega-Megabytes. Although the size of such arrays, especially those of 3 or more dimensions, makes them clearly impossible to use in a practical situation, the method of assignment has been explained in terms of such arrays, for clarity in understanding the process of accumulating, from all segments of a test routine, the information which is needed, during the assignment procedure, to avoid conflicts during the testing process.

An effective and practical technique for assigning nodes to connection points in 2 by n or 4 by n multiplexing schemes is to divide the groups of n connection points into subgroups of n/2 or n/4 connection points, respectively. Then node allocation can be carried out on a 1 by n/2 or 1 by n/4 basis, and, finally, the subgroups recombined into full groups. This procedure avoids the use of the very large arrays of 3 or more dimensions, yet produces allocations of quite satisfactory efficiency. The results of carrying out this procedure for the same examples as shown in Table I are shown in Tables II and III, following.

Another technique for avoiding the use of the large arrays in the computational process is to recognize that these arrays, in practice, are very sparsely marked, and various techniques for dealing with sparse matrices are applicable to make the process practical with finite computational capability. For example, only the sets of indices of the marked locations may be stored in groups of 2, 3 or 5, as appropriate for the above examples. Then, before a node is assigned to a group, those lists can be searched to ensure that no conflict will arise during any part of the test. Such procedure has also produced assignments which are highly efficient, and without requiring an inordinate amount of computer processing.

TABLE II

EFFICIENCY OF ASSIGNMENT OF NODES TO PINS FOR A SYSTEM
WHICH IS MULTIPLEXED ON A BASIS OF 4 × 16 BY DIVISION INTO SUB-
GROUPS AND ASSIGNING ON A 1 × 4 BASIS

| NODES ON BOARD | MAXIMUM NODES IN ONE BURST | ASSIGNED IN SUB-GROUPS OF | NUMBER OF 4 × 16 GROUPS NEEDED FOR TOTAL NODES | FOR MAX NODES PER BURST | NUMBER OF SUB-GROUPS USED | NUMBER OF 4 × 16 GROUPS USED | EFFI-CIENCY |
|---|---|---|---|---|---|---|---|
| 175 | 47 | 1 × 4 | 11 | 12 | 59 | 15 | 0.80 |
| 196 | 44 | 1 × 4 | 13 | 11 | 57 | 15 | 0.87 |
| 222 | 54 | 1 × 4 | 14 | 14 | 64 | 16 | 0.87 |
| 265 | 24 | 1 × 4 | 17 | 6 | 70 | 18 | 0.94 |
| 685 | 60 | 1 × 4 | 43 | 15 | 172 | 43 | 1.00 |
| 695 | 54 | 1 × 4 | 44 | 14 | 175 | 44 | 1.00 |
| 1574 | 59 | 1 × 4 | 99 | 15 | 396 | 99 | 1.00 |

TABLE III

EFFICIENCY OF ASSIGMENT OF NODES TO PINS FOR A SYSTEM WHICH IS MULTIPLEXED ON A BASIS OF 2 × 16 BY DIVISION INTO SUB-GROUPS AND ASSIGNING ON A 1 × 8 BASIS

| NODES ON BOARD | MAXIMUM NODES IN ONE BURST | ASSIGNED IN SUB-GROUPS OF | NUMBER OF 2 × 16 GROUPS NEEDED FOR TOTAL NODES | NUMBER OF 2 × 16 GROUPS NEEDED FOR MAX NODES PER BURST | NUMBER OF SUB-GROUPS USED | NUMBER OF 2 × 16 GROUPS USED | EFFI-CIENCY |
|---|---|---|---|---|---|---|---|
| 175  | 47 | 1 × 8 | 11 | 24 | 49  | 25 | 0.96 |
| 193  | 44 | 1 × 8 | 13 | 22 | 47  | 24 | 0.92 |
| 222  | 54 | 1 × 8 | 14 | 14 | 54  | 27 | 1.00 |
| 265  | 24 | 1 × 8 | 17 | 12 | 39  | 20 | 0.85 |
| 685  | 60 | 1 × 8 | 43 | 30 | 89  | 45 | 0.96 |
| 695  | 54 | 1 × 8 | 44 | 27 | 89  | 45 | 0.98 |
| 1574 | 59 | 1 × 8 | 99 | 30 | 211 | 99 | 0.93 |

Preferred details as to types of driver-sensors, digital and analog test equipment, computer programs for automatic control, etc. are now well known in the art and may be employed with the technique of the present invention, reference being made to the previously cited prior patents and equipments for examples of the same. Modifications will occur to those skilled in the art and such are considered to fall within the spirit and scope of the invention as defined in the appended claims.

What is claimed is:

1. A method of performing a test on electronic circuits and the like comprising a relatively large number of nodes, that comprises, assigning each node to a connection point in a group of connection points connectable at any given time with only a predetermined number of signal lines connectable with test equipment, the predetermined number of signal lines being less than the number of connection points in the group; controlling said assigning of the nodes of specific connection points in a manner that insures that no more sets of nodes, used simultaneously in any test, are assigned to the same group of connection points than there are signal lines connectable to that group of connection points, wherein, at a given time, a set of nodes is defined as a set consisting of all the nodes in a group that are logically capable, according to the predetermined test, of being driven or sensed by a common instrument at that given time; and selectively connecting the connection points to the test equipment to connect the test equipment to the nodes for conducting desired testing.

2. A method as claimed in claim 1 and in which said test equipment comprises digital test equipment provided with pin-connectable driver-sensors, and in which said assigning of nodes to predetermined connection points determines a corresponding group of pins connectable by said switching to said driver sensors, with the assigning of nodes to pins being effected to avoid conflict arising if the number of driver-sensors available to a group were not sufficient to serve all pins of that group that are simultaneously active during testing.

3. A method as claimed in claim 2 and in which said test equipment also includes analog test equipment having a limited number of analog lines, and in which said switching further is effected from said limited number of lines to the said connection points; and said assigning is also effected to insure that no more sets of connection points than the said limited number of lines in any group are used simultaneously for analog testing.

4. A method of reducing the number of switches for analog test instruments required for the automatic testing of electronic circuits comprising a large number of nodes, from the number that would be required if each analog line were connectable to any circuit mode, the method comprising dividing the large number of nodes into a relatively small number of groups of nodes and associating the same with a group of connection points; insuring that no more connection points than the said limited number of analog instrument lines in any group are used simultaneously for testing; and selectively switching connections from a limited number of lines connected to the analog instruments to said connection points.

5. A method as claimed in claim 3 and in which the number of connection points in each group is eight or a multiple of eight.

6. A method as claimed in claim 5 and in which the number of connection points in each group is at least sixteen and the number of analog connection lines is at least four.

7. A method as claimed in claim 2 and in which said controlling step is effected by digital computation that assigns nodes (n) to pins in at least one of 2 by n and 4 by n multiplexing.

8. A method as claimed in claim 2 and in which the number of connection points in each group is eight or a multiple of eight and said assigning enables driver-sensors to be connected to any of their corresponding eight or multiple-of-eight connection points.

9. A test system for performing a test on an electric circuit under test having a large number of test nodes to be driven or sensed during the test, only a fraction of of the test nodes being separately driven or sensed at any given time, the system comprising:

A. a plurality of groups of connection points;

B. a plurality of digital instruments, each digital instrument having a test port and being operable to drive or sense test nodes placed into electrical communication with its test port, the digital instruments being organized in sets of at least one digital instrument each, all digital instruments in each set having a common test port, each set of digital instruments being associated with a single group of connection points, the number of sets of digital instruments associated with a group being less than the number of connection points in the group;

C. a board contact associated with each test node, the board contacts being so positioned with respect to each other as to permit all of the board contacts to contact their associated test nodes simultaneously;

D. means connecting each board contact to a connection point, and thereby associating a test node with each connection point, so that the greatest number of sets of test nodes associated with connection points in any group of connection points is less than or equal to the number of sets of digital instruments associated with that group, wherein, at a given time, a set of test nodes is defined as a set consisting of all the test nodes associated with the same group that are logically capable, according to the test, of being driven or sensed by a common digital instrument at that given time;

E. switch means operable selectively to connect each digital instrument only to the connection points of the group associated therewith; and F. control means for operating the switch means to connect the digital instruments to the connection points, and for operating the digital instruments to drive and sense the test nodes, in accordance with the test.

10. A test system as defined in claim 9 wherein:

A. the switch means includes:
  i. a plurality of intermediate lines, each intermediate line being associated with a different set of digital instruments and with the group of connection points associated with that set of digital instruments, each intermediate line being connected to the test ports of the set of digital instruments associated therewith; and
  ii. a switch matrix connected between the intermediate lines and the connection points for selectively connecting each intermediate line to only the connection points of its associated group; and B. the test system further includes:
  i. a plurality of analog test instruments having instrument lines for driving and/or sensing test nodes placed into electrical communication with the instrument lines; and
  ii. electrical-communication means for selectively placing the instrument lines into electrical communication with the intermediate lines so that the instrument lines can be placed into electrical communication with the connection points by operation of the switch matrix.

11. A test system as defined in claim 10 wherein the electrical-communication means includes:

A. an instrument bus including a plurality of bus lines, the number of bus lines being less than the number of instrument lines;

B. a second switch matrix for selectively connecting the bus lines to the intermediate lines; and C. a third switch matrix for selectively connecting the bus lines to the instrument lines.

12. A test system as recited in claim 11 wherein the switch means includes a switch associated with each set of digital instruments and interposed in the instrument line associated with that digital-instrument set for isolating the digital-instrument set from the connection points when a bus line is connected to the associated intermediate line.

13. A test system as recited in claim 10 wherein the switch means includes a switch associated with each set of digital instruments and interposed in the instrument line associated with that digital-instrument set for isolating the digital-instrument set from the connection points when a bus line is connected to the associated intermediate line.

14. A test system as defined in claim 9 wherein each set of set of digital instruments comprises a driver for driving a load connected to its test port and a sensor for sensing signals on its test port, the digital instruments being operable selectively to drive and sense test nodes placed into electrical communication therewith.

15. An analog test system for performing a test in which a plurality of analog test instruments having instrument lines are operated to drive and/or sense a large number of test nodes in an electric circuit under test placed selectively in electrical communication with the instrument lines, only a fraction of the test nodes being driven or sensed at any given time, the test system comprising:

A. a plurality of groups of connection points;

B. at least one intermediate line associated with each group, each intermediate line being associated with a single group of connection points;

C. a board contact associated with each test node, the board contacts being so positioned with respect to each other as to permit all of the board contacts to contact their associated nodes simultaneously;

D. means connecting each board contact to a connection point, and thereby associating a test node with a connection point, so that the greatest number of sets of test nodes associated with connection points in any group of connection points is less than or equal to the number intermediate lines associated with that group, wherein, at a given time, a set of test nodes is defined as a set consisting of all the test nodes associated with the same group that are logically capable, according to the test, of being driven or sensed by a common instrument at that given time;

E. a switch matrix for selectively connecting the intermediate lines associated with each group to the connection points of that group, each intermediate line being connectable by the switch matrix to only the connection points of its associated group;

F. electrical-communication means for selectively placing the intermediate lines into electrical communication with the instrument lines so that the instrument lines can be placed into electrical communication with the connection points by operation of the switch matrix; and G. control means for operating the analog instruments and the switch matrix successively to connect the analog instruments to the connection points, for operating the means for selectively placing the intermediate lines into electrical communication with the instrument lines, and for operating the analog instruments to drive and sense the test nodes in accordance with the test.

16. An analog test system as defined in claim 15 wherein the electrical-communication means includes:

A. an instrument bus including a plurality of bus lines, the number of bus lines being less than the number of instrument lines;

B. a second switch matrix for selectively connecting the bus lines to the intermediate lines; and C. a third switch matrix for selectively connecting the bus lines to the instrument lines.

17. A method of performing a test on an electric circuit under test having a large number of test nodes to be driven or sensed during the test, only a fraction of the test nodes being driven or sensed simultaneously, comprising the steps of:

A. providing a board contact associated with each test node, the board contacts being so positioned with respect to each other as to permit all of the board contacts to contact their associated test nodes simultaneously;
B. providing a plurality of groups of connection points adapted for connection to the board contacts;
C. providing a plurality of digital instruments, each digital instrument having a test port and being operable to drive or sense test nodes placed into electrical communication with its test port, the digital instruments being organized in sets of at least one digital instrument each, all digital instruments in each set having a common test port, each set of digital instruments being associated with a single group of connection points, the number of sets of digital instruments associated with a group being less than the number of connection points in the group;
D. providing switch means connected between the connection points and the digital instruments for selectively connecting each digital instrument only to connection points in the group of connection points associated therewith;
E. connecting each connection point to a board contact, connection of connection points to board contacts thereby resulting in assignment of the board contacts and test nodes to groups of board contacts and test nodes associated with groups of connection points and with the digital instruments associated therewith, the connection step comprising, before connecting a given board contact associated with a given test node to a given connection point to assign the n+mth set of test nodes to a given group associated with n−1 sets of digital instruments, (i) creating a list of all n-member combinations of test nodes driven or sensed simultaneously and (ii) connecting the given connection point to the given board contact only if the list contains no combinations that will be included in the given group if the given connection point is connected to the given board contact, wherein m is an integer greater than or equal to zero, and wherein a set of test nodes is defined, at any given time, as a set consisting of all the test nodes associated with the same group that are logically capable, according to the test, of being driven or sensed by a common digital instrument at that given time;
F. placing each board contact into contact with its associated test node; and
G. driving and sensing the test nodes by operating the digital instruments and the switch means in accordance with the test.

18. A method of performing a test on an electric circuit under test having a large number of test nodes to be driven or sensed by placing into electrical communication therewith instrument lines from test instruments, only a fraction of the test nodes being driven or sensed simultaneously, comprising the steps of:
A. providing a board contact associated with each test node, the board contacts being so positioned with respect to each other as to permit all of the board contacts to contact their associated nodes simultaneously;
B. providing a plurality of groups of connection points adapted for connection to the board contacts;
C. providing at least one intermediate line associated with each group;
D. providing electrical-communication means for selectively placing the intermediate lines into electrical communication with the instrument lines;
E. providing switch means connected between the connection points and the intermediate lines for selectively connecting each intermediate line only to connection points in the group of connection points associated therewith, the number of intermediate lines associated with a group being less than the number of connection points in the group;
F. connecting each connection point to a board contact, connection of connection points to board contacts thereby resulting in assignment of the board contacts and test nodes to groups of board contacts and test nodes associated with groups of connection points and with the intermediate lines associated therewith, the connection step comprising, before connecting a given board contact associated with a given test node to a given connection point to assign the n+mth set of test nodes to a given group associated with n−1 sets of intermediate lines, (i) creating a list of all n-member combinations of test nodes driven or sensed simultaneously and (ii) connecting the given connection point to the given connection node only if the list contains no combinations that will be included in the given group if the given connection point is connected to the given board contact, wherein m is an integer greater than or equal to zero, and wherein a set of test nodes is defined, at any given time, as a set consisting of all the test nodes associated with the same group that are logically capable, according to the test, of being driven or sensed by a common instrument at that given time;
G. placing each connection point into contact with its associated test node; and
H. driving and sensing the nodes by operating the test instruments and the switch means in accordance with the test.

* * * * *